(12) United States Patent
Lee et al.

(10) Patent No.: US 6,518,115 B2
(45) Date of Patent: Feb. 11, 2003

(54) CMOS IMAGE SENSOR AND METHOD FOR FABRICATING THE SAME

(75) Inventors: Jae-Dong Lee, Ichon (KR); Sang-Joo Lee, Ichon (KR)

(73) Assignee: Hyundai Electronics Industries Co., Ltd., Ichon (KR)

(*) Notice: Subject to any disclaimer, the term of this patent is extended or adjusted under 35 U.S.C. 154(b) by 0 days.

(21) Appl. No.: 09/891,212

(22) Filed: Jun. 26, 2001

(65) Prior Publication Data

US 2001/0039068 A1 Nov. 8, 2001

Related U.S. Application Data

(62) Division of application No. 09/604,772, filed on Jun. 28, 2000.

(30) Foreign Application Priority Data

Jun. 28, 1999 (KR) .............................. 99-24951

(51) Int. Cl.[7] .................................. H01L 21/8238
(52) U.S. Cl. .................................. 438/231; 438/48
(58) Field of Search .............................. 438/48, 56, 57, 438/229, 230, 231, 299

(56) References Cited

U.S. PATENT DOCUMENTS

| 4,748,486 A | 5/1988 | Miyatake |
| 5,066,994 A | 11/1991 | Erhardt |
| 5,070,380 A | 12/1991 | Erhardt et al. |
| 5,241,198 A | 8/1993 | Okada et al. |
| 5,625,210 A | 4/1997 | Lee et al. |
| 5,877,521 A | * 3/1999 | Johnson et al. ............. 257/223 |
| 5,904,493 A | 5/1999 | Lee et al. |
| 6,023,081 A | * 2/2000 | Drowley et al. ............ 257/292 |
| 6,027,955 A | 2/2000 | Lee et al. |

FOREIGN PATENT DOCUMENTS

| JP | 62-296555 | 12/1987 | ............ H01L/27/14 |
| JP | 3-225958 | 10/1991 | ......... H01L/27/148 |

OTHER PUBLICATIONS

Wolf, S.; Silicon Processing for the VLSI Era Volume 3: The Submicron MOSFET, Sunset Beach, CA, 1995, pp. 595–597.*

* cited by examiner

Primary Examiner—John F. Niebling
Assistant Examiner—Christopher Lattin
(74) Attorney, Agent, or Firm—Jacobson Holman PLLC

(57) ABSTRACT

A CMOS image sensor containing a plurality of unit pixels, each unit pixel having a light sensing region and a peripheral circuit region, includes: a semiconductor substrate of a first conductive type; a transistor formed on the peripheral circuit region of the semiconductor substrate, wherein the transistor has a gate oxide layer and a gate electrode formed on the gate oxide layer; spacers formed on sidewalls of the gate oxide layer and the gate electrode, wherein one spacer are formed on the light sensing region; a first doping region of a second conductive type formed on the light sensing region, wherein the first doping region is extended to an edge of the gate electrode; and a second doping region of the first conductive type formed on the first doping region, wherein the second doping region is extended to an edge of a spacer formed on the light sensing region.

7 Claims, 7 Drawing Sheets

CMOS IMAGE SENSOR AND METHOD FOR FABRICATING THE SAME

This is a divisional application of prior application Ser. No. 09/604,772 filed Jun. 28, 2000.

FIELD OF THE INVENTION

The present invention relates to an image sensor; and, more particularly, to a CMOS image sensor integrated with a photodiode and a method for fabricating the same, which is capable of improving a charge capacity and an optical sensitivity thereof.

DESCRIPTION OF THE PRIOR ART

As is well known, an image sensor is an apparatus for sensing a light reflected from an object and generating an image data. Especially, an image sensor fabricated by using a CMOS (complementary metal oxide semiconductor) technology is called a CMOS image sensor.

Generally, the CMOS image sensor includes a plurality of unit pixels having a light sensing region and a peripheral circuit region. Each of the unit pixels also includes a light sensing element formed on the light sensing region and a plurality of transistors formed on the peripheral circuit region. The light sensing element such as a photodiode senses incident light reflected from an object, to accumulate photoelectric charges that are generated due to an incident light. The transistors control a transfer of the photoelectric charges.

FIG. 1 is a diagram showing a layout of a unit pixel contained in a conventional CMOS image sensor. Reference numerals 102 and 104 represent gate electrodes for transistors, 103 a floating diffusion region, and 105 an isolation region. A reference numeral 106 represents a light sensing region and a reference numeral 107 represents a semiconductor substrate. FIGS. 2A to 2D are cross-sectional views, taken along the line A–A', showing sequential steps for fabricating a conventional unit pixel.

Hereinafter, a method for fabricating a conventional unit pixel with reference to FIG. 1 and FIGS. 2A to 2D.

As shown in FIG. 2A, a P-type epitaxial layer 20 is grown on a P-type substrate (not shown). Patterned field oxide layers 30, patterned gate oxide layers 40, and gate electrodes 50 are sequentially formed on a peripheral circuit region 11 of the P-type epitaxial layer 20, to thereby provide a semiconductor structure.

As shown in FIG. 2B, after forming mask patterns 60A on the semiconductor structure, a low-concentration and high-energy ion implantation is performed to form an N-type doping region 70, on a portion to be a light sensing region 10. At this time, referring to FIG. 1, the mask patterns 60A are designed to cover a portion of the light sensing region 106, not to expose an entire light sensing region 106. Furthermore, the mask patterns 50A are designed to expose a portion of the gate electrode 104.

As shown in FIG. 2C, the mask patterns 60A are removed and another mask patterns 60B are formed. Then, a high-concentration and low-energy ion implantation is performed to form a P-type doping region 80 beneath a surface of P-type epitaxial layer 20. At this time, referring to FIG. 1, the mask patterns 60B are designed to expose the entire light sensing region 106 and to expose a portion of the gate electrode 104.

As shown in FIG. 2D, spacers 90 and source/drain junction regions 100 are formed on the peripheral circuit region 11.

As can be seen, a conventional photodiode has a PNP structure, which is constituted with the P-epitaxial layer 20, the N-type doping region 70 and the P-type doping region 80. The N-type doping region 70 plays a role of a depletion layer for accumulating photoelectric charges that are generated due to the incident light. Also, the N-type doping region 70 can be fully depleted due to the P-type doping region 80.

However, in case where the incident light is a blue light having a short wavelength, the incident can not be transmitted deeply up to the P-type epitaxial layer 20. Therefore, the photoelectric charges are generated at a surface of the photodiode. At this time, the photoelectric charges are decreased due to the existence of the P-type doping region 80, so that the optical sensitivity is relatively degraded.

Furthermore, since the P-type doping region 80 is aligned at the edges of the gate electrodes 204 by the ion implantation, dopants of the P-type doping region 80 are diffused to channel regions of the transistors at a following thermal treatment process. As a result, a high potential barrier is caused, and charge transfer efficiency representing a rate of the photoelectric charges transferred to the floating diffusion region 103 is decreased.

SUMMARY OF THE INVENTION

It is, therefore, an object of the present invention to provide a CMOS image sensor integrated with a photodiode and a method for fabricating the same, which is capable of improving a charge capacity and an optical sensitivity thereof.

In accordance with an aspect of the present invention, there is provided a CMOS image sensor containing a plurality of unit pixels, each unit pixel having a light sensing region and a peripheral circuit region, comprising: a semiconductor substrate of a first conductive type; a transistor formed on the peripheral circuit region of the semiconductor substrate, wherein the transistor has a gate oxide layer and a gate electrode formed on the gate oxide layer; spacers formed on sidewalls of the gate oxide layer and the gate electrode, wherein one spacer are formed on the light sensing region; a first doping region of a second conductive type formed on the light sensing region, wherein the first doping region is extended to an edge of the gate electrode; and a second doping region of the first conductive type formed on the first doping region, wherein the second doping region is extended to an edge of a spacer formed on the light sensing region.

In accordance with another aspect of the present invention, there is provided a 7. A method for fabricating a CMOS image sensor having a plurality of unit pixels, each-unit pixel having a light sensing region and a peripheral circuit region, comprising the steps of: a) providing a semiconductor substrate of the first conductive type; b) sequentially forming a gate oxide layer and a gate electrode on the peripheral circuit region of the semiconductor substrate; c) forming a first doping region of a second conductive type on the light sensing region of the semiconductor substrate, wherein the first doping region is extended to an edge of the gate electrode; d) forming spacers on sidewalls of the gate oxide layer and the gate electrode, wherein one spacer is formed on the light sensing region; and e) performing an ion implantation to form a second doping region of the first conductive type, wherein the second doping region is extended to an edge of a spacer formed on the light sensing region.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

Figure 1:
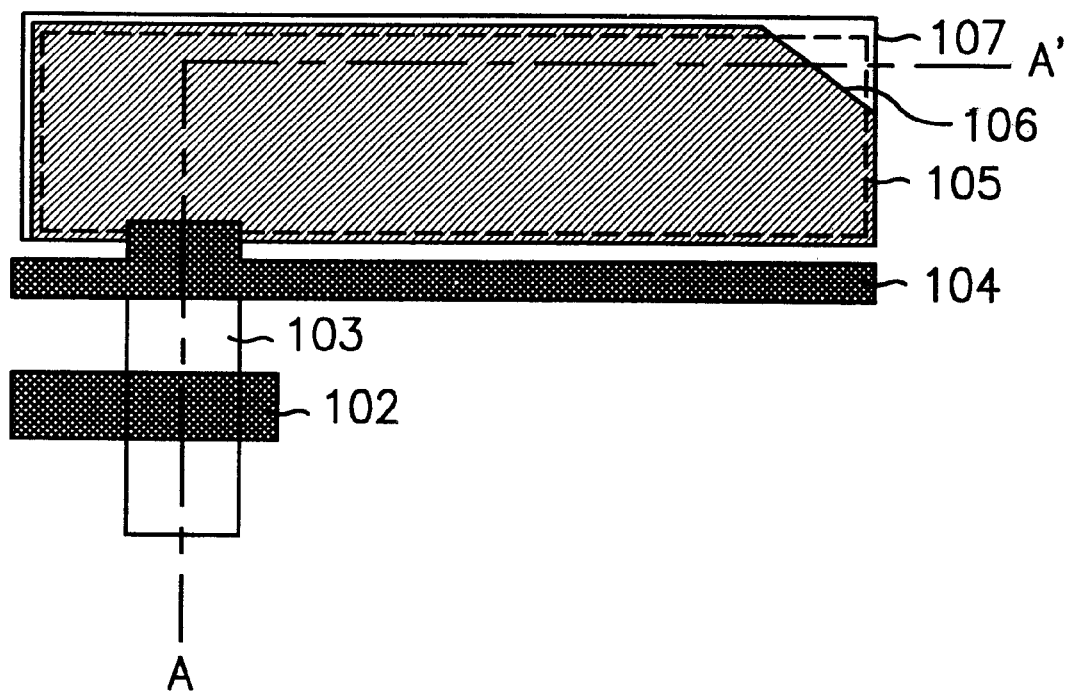
FIG. 1 is a diagram showing a layout of a unit pixel contained in a conventional CMOS image sensor.
Figure 2A:
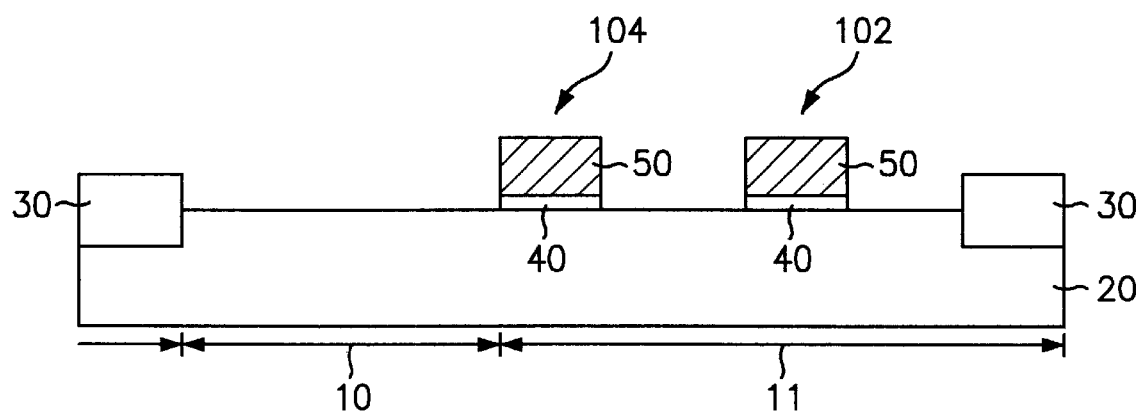
FIGS. 2A to 2D are cross-sectional views, taken along the line A–A', showing sequential steps for fabricating a unit pixel contained in a conventional CMOS image sensor.
Figure 2B:
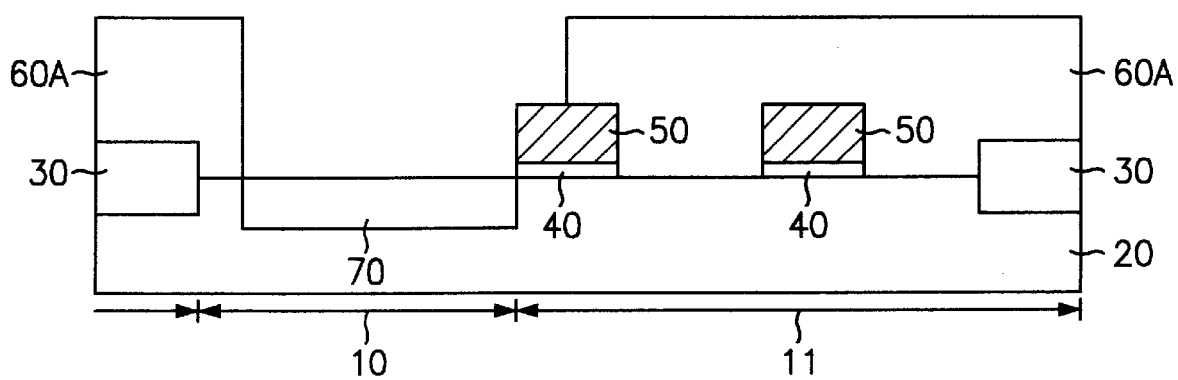
Figure 2C:
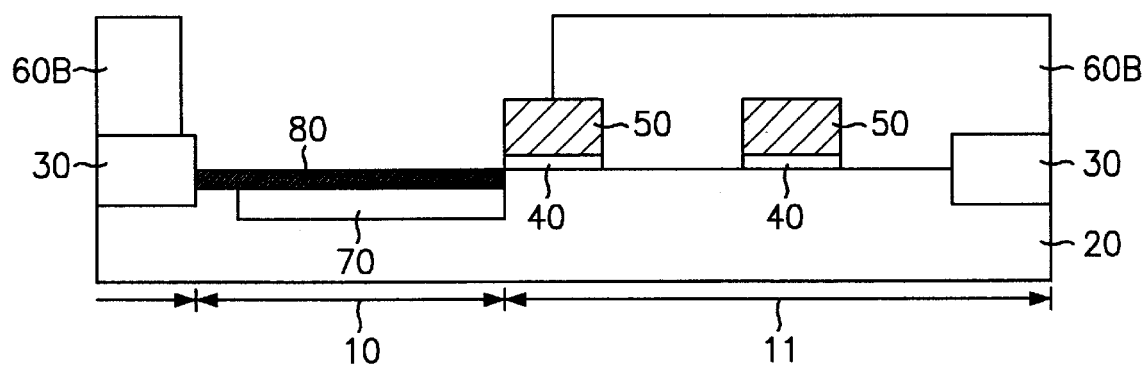
Figure 2D:
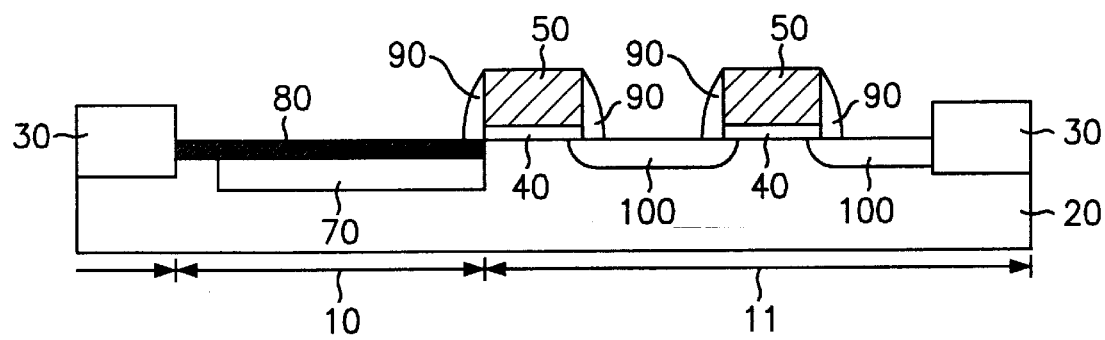
Figure 3:
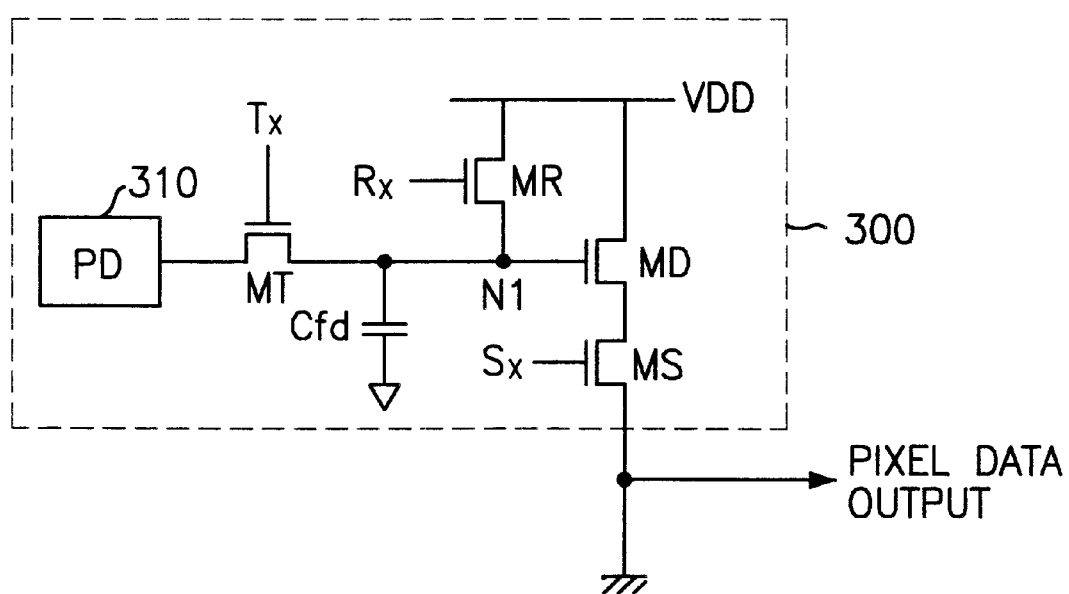
FIG. 3 is a schematic diagram illustrating a unit pixel contained in a CMOS image sensor.

FIG. 3 is a schematic diagram illustrating a unit pixel contained in a CMOS image sensor according to the present invention.

The CMOS image sensor includes a plurality of unit pixels arranged in a matrix. Each unit pixel 300 includes a photodiode 310 as the light sensing element and four transistors, respectively. Also, the four transistors in the unit pixel 310 includes a transfer transistor MT as a first switching means, a reset transistor MR as a second switching means, a drive transistor MD as a amplification means and a select transistor MS as a third switching means.

Figure 4:
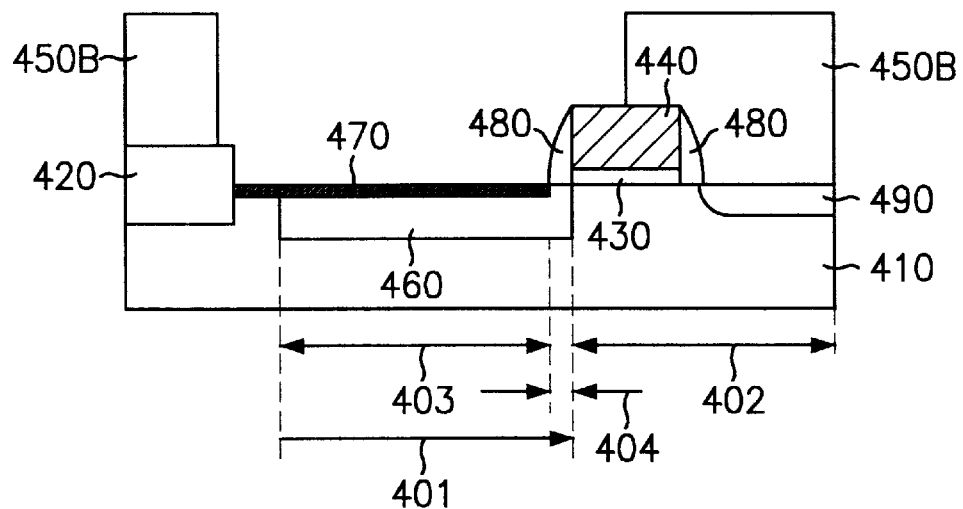
FIG. 4 is a cross-sectional view illustrating a unit pixel in accordance with the present invention.

FIG. 4 is a cross-sectional view illustrating a unit pixel 310 in accordance with an embodiment of the present invention.

Referring to FIG. 4, a P-type epitaxial layer 410 is formed on a semiconductor substrate (not shown) and an N-type doping region 460 is formed on a light sensing region 401 of the P-type epitaxial layer 410. A P-type doping layer 470 is formed on the N-type doping region 460. A gate oxide layer LM 430 and a gate electrode 440 are formed on a peripheral circuit region 402 of the P-type epitaxial layer 410 and spacers 480 are formed on sidewalls of the gate oxide layer 430 and the gate electrode 440.

At this time, while the N-type doping region 460 is extended to an edge of the gate electrode 440, the P-type doping region 470 is extended to an edge of the spacers 480. That is, the P-type doping region 470 is spaced away from the peripheral circuit region 402 by a predetermined distance corresponding to a length of the spacers 480.

Accordingly, the photodiode in accordance with an embodiment of the present invention provides a PNP structure 403 and a NP structure 404. The PNP structure 403 is constituted with the P-type doping region 470, the N-type doping region 460 and the P-type epitaxial layer 410. The NP structure 403 is constituted with the N-type-doping region 460 and the P-type doping region 470.

By forming the photodiode with the PNP structure and the NP structure, a total charge capacity of the photodiode is increased, so that an optical sensitivity is remarkably improved.

Figure 5:
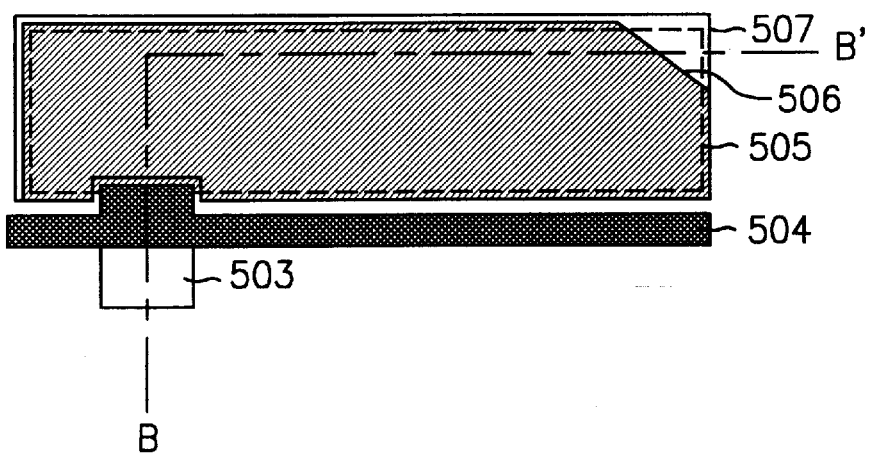
FIG. 5 is a diagram illustrating a layout of a unit pixel contained in a CMOS image sensor in accordance with the present invention.

FIG. 5 is a diagram illustrating a layout of a unit pixel contained in a CMOS image sensor in accordance with the present invention. A reference numerals 504 represents a gate electrode of the transfer transistor MT, 503 a floating diffusion region, and 505 an isolation region. A reference numeral 506 represents a light sensing region and a reference numeral 507 represents a semiconductor substrate. FIGS. 6A to 6E are cross-sectional views, taken along the line B–B' in FIG. 5, showing sequential steps for manufacturing a unit pixel shown in FIG. 5. For the sake of simplicity, only a photodiode 310 and a transfer transistor MT are illustrated.

Hereinafter, a method for fabricating a unit pixel in accordance with an embodiment of the present invention with reference to FIG. 5 and FIGS. 6A to 6E, in case where a P-type semiconductor substrate is used.

Figure 6A:
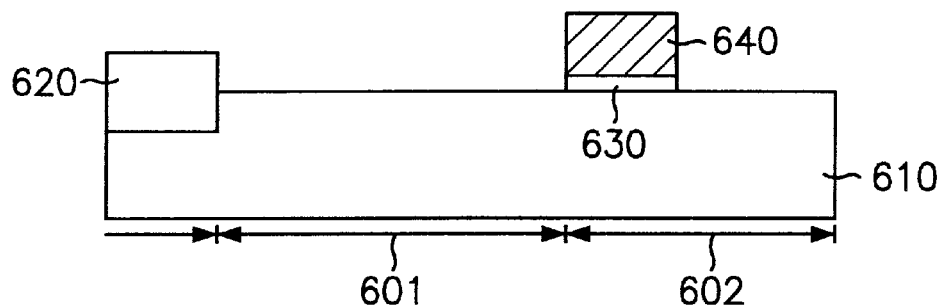
FIGS. 6A to 6E are cross-sectional views, taken along the line B–B' in FIG. 4, showing sequential steps for manufacturing a unit pixel shown in FIG. 4.

Referring to FIG. 6A, a P-type epitaxial layer 610 is grown on a P-type semiconductor substrate (not shown). A patterned field oxide layer 620, a patterned gate oxide layer 630, and a gate electrode 640 are sequentially formed on a peripheral circuit region 601 of the P-type epitaxial layer 610, to thereby provide a semiconductor structure.

Figure 6B:
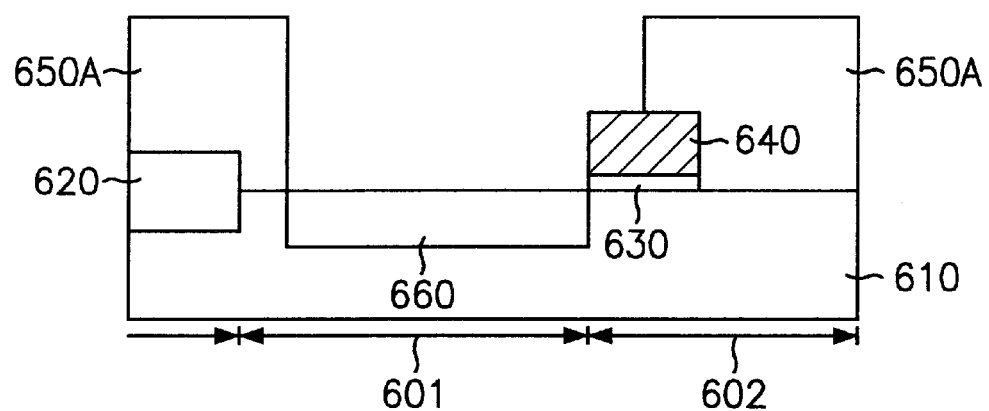

Referring to FIG. 6B, after forming mask patterns 650A on the semiconductor structure, a low-concentration and high-energy ion implantation is performed to form an N-type doping region 660 on a light sensing region 601. The N-type doping region 660 is extended to an edge of the gate electrode 640. At this time, referring to FIG. 5, the mask patterns 650A are designed to cover a portion of the light sensing region 506, not to expose an entire light sensing region 506. Furthermore, the mask patterns 650A are designed to expose a portion of the gate electrode 504.

Figure 6C:
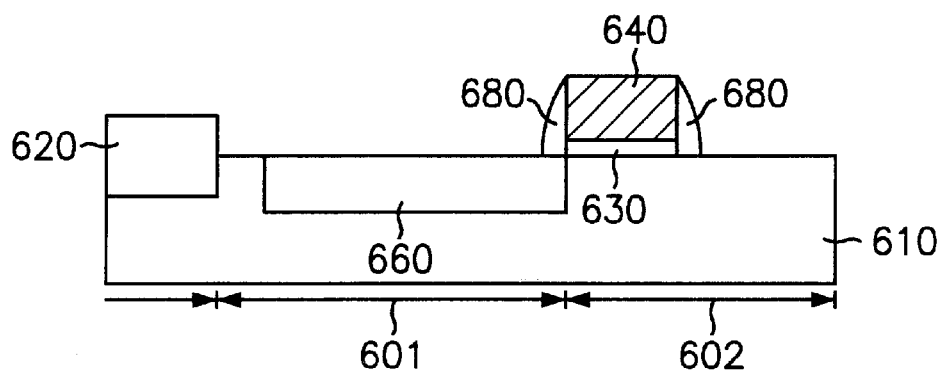

Referring to FIG. 6C, an insulating layer (not shown) is deposited on a resulting structure and a blanket dry etching is performed to form spacers 680 on sidewalls of the gate oxide layer 630 and the gate electrode 640.

Figure 6D:
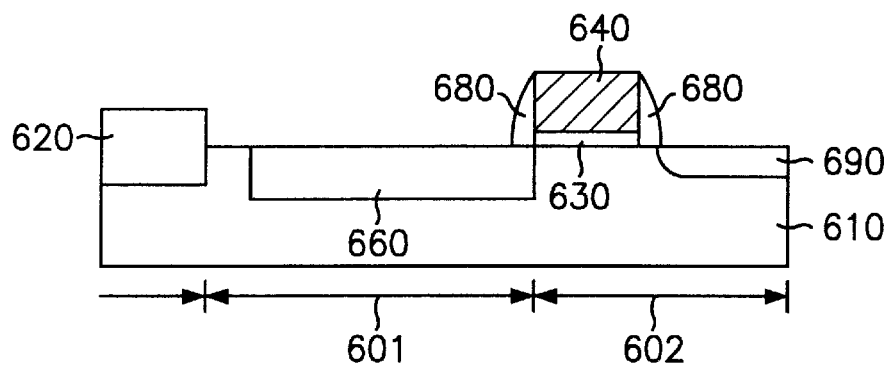

Referring to FIG. 6D, a diffusion region 690 is formed on a portion to be a source/drain of the transfer transistor MT by an ion implantation. At this time, a mask pattern covering the light sensing region is used. Then, a thermal treatment process is performed in order to activate the ion implanted dopants.

Figure 6E:
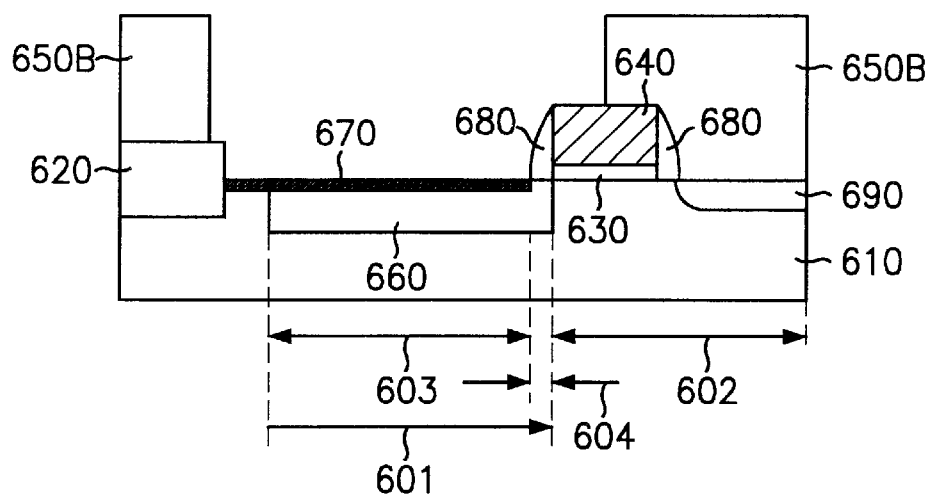

Referring to FIG. 6E, after forming a mask pattern 650B, a high-concentration and low-energy ion implantation is performed to form a P-type doping region 670 beneath a surface of the P-type epitaxial layer 610. At this time, since the spacers 680 are previously formed, the P-type doping region 670 is extended to an edge of the spacers 680. That is, the P-type doping, region 670 is spaced away from the peripheral circuit region 602 by a predetermined distance. The predetermined distance corresponds to a length of the spacers 680. At this time, referring to FIG. 5, the mask patterns 650B are designed to expose the entire light sensing region 506 and to expose a portion of the gate electrode 504.

As described above, since the P-type doping region 670 is formed after forming the spacers 680, the photodiode provides a PNP structure and an NP junction structure. That is, like the prior art, the PNP structure is constituted with the P-type doping region 670, the N-type doping region 660 and the P-type epitaxial substrate 610. Additionally, the NP structure, which is constituted with the N-type doping region 660 and the P-type doping-region 670, is formed at the edge of the gate electrode.

The conventional photodiode has only the charge capacity composed of a junction capacity between the P-type doping region and the N-type doping region and a junction capacity between the N-type doping region and the P-type epitaxial layer. On the contrary, the photodiode according to the present invention includes an additional charge capacity corresponding to a junction capacity between the N-type doping region 660 and the P-type doping region 670. Therefore, a total charge capacity is increased compared with the prior art.

Furthermore, since the P-type doping region 670 is formed after the thermal treatment process, the dopants of the P-type doping region 670 are prevented from a thermal diffusion, so that an optical sensitivity is remarkably improved especially at a short wavelength and noise effects such as a dark current is effectively removed.

Figure 7:
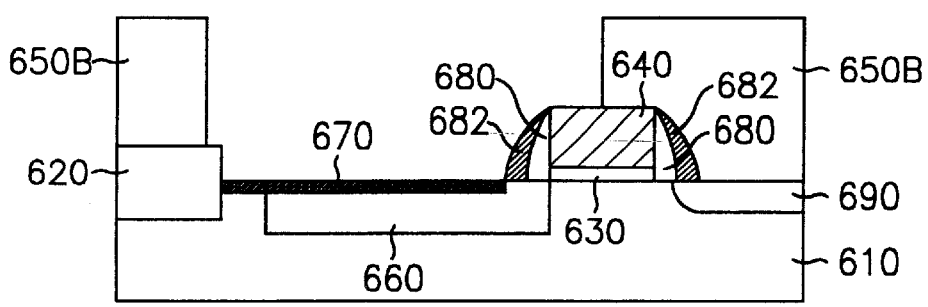
FIG. 7 is a cross-sectional view illustrating a unit pixel in accordance with another embodiment of the present invention.

FIG. 7 is a cross-sectional view illustrating a unit pixel in accordance with another embodiment of the present invention.

As shown in FIG. 7, it is preferably possible to form spacers with at least two layers 682 and 680 with consideration of a distance between the edge of the gate electrode 640 and the P-type doping region 670.

As described above, by forming the photodiode having the PNP structure and the NP structure, the optical sensitivity and the charge capacity are improved and the charge transfer efficiency is remarkably improved.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a CMOS image sensor having a plurality of unit pixels, each unit pixel having a light sensing region and a peripheral circuit region, comprising the steps of:
   a) providing a semiconductor substrate of the first conductive type;
   b) sequentially forming a gate oxide layer and a gate electrode on the peripheral circuit region of the semiconductor substrate;
   c) forming a first doping region of a second conductive type on the light sensing region of the semiconductor substrate, wherein the first doping region is extended only up to an outer edge of the gate electrode;
   d) forming spacers on sidewalls of the gate oxide layer and the gate electrode, wherein one spacer is formed on the light sensing region; and
   e) performing an ion implantation to form a second doping region of the first conductive type, wherein the second doping region is extended only up to an outer edge of the one spacer formed on the light sensing region.

2. The method as recited in claim 1, wherein the first doping region is formed by using a mask pattern, wherein the mask pattern covers a portion of the light sensing region and exposing a portion of the gate electrode.

3. The method as recited in claim 1, wherein the spacers are formed by using a blanket dry etching.

4. The method as recited in claim 1, after the step d), further comprising the step of forming a source/drain region for a transistor on the peripheral circuit region.

5. The method as recited in claim 1, wherein the second doping region is formed by using a mask pattern, wherein the mask exposes an entire light sensing region and a portion of the peripheral circuit region.

6. The method as recited in claim 1, after the step d), further comprising the step of forming another spacers on a resulting structure.

7. The method as recited in claim 1, wherein the first conductive type is a P-type and the second conductive type is an N-type.

* * * * *